US012593486B2

(12) United States Patent
Cook et al.

(10) Patent No.: US 12,593,486 B2
(45) Date of Patent: Mar. 31, 2026

(54) DUAL CONTACT PROCESS WITH SELECTIVE DEPOSITION

(71) Applicant: Intel Corporation, Santa Clara, CA (US)

(72) Inventors: Kevin Cook, Portland, OR (US); Anand S. Murthy, Portland, OR (US); Gilbert Dewey, Beaverton, OR (US); Nazila Haratipour, Hillsboro, OR (US); Chi-Hing Choi, Portland, OR (US); Jitendra Kumar Jha, Hillsboro, OR (US); Srijit Mukherjee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 878 days.

(21) Appl. No.: 17/033,373

(22) Filed: Sep. 25, 2020

(65) Prior Publication Data

US 2022/0102506 A1 Mar. 31, 2022

(51) Int. Cl.
| | |
|---|---|
| *H01L 29/40* | (2006.01) |
| *H10D 30/01* | (2025.01) |
| *H10D 30/62* | (2025.01) |
| *H10D 64/01* | (2025.01) |
| *H10D 64/62* | (2025.01) |
| *H10D 84/01* | (2025.01) |
(Continued)

(52) U.S. Cl.
CPC ........... *H10D 64/01* (2025.01); *H10D 30/024* (2025.01); *H10D 30/62* (2025.01); *H10D 30/6219* (2025.01); *H10D 64/62* (2025.01);

*H10D 84/017* (2025.01); *H10D 84/0186* (2025.01); *H10D 84/0193* (2025.01); *H10D 84/038* (2025.01); *H10D 84/853* (2025.01)

(58) Field of Classification Search
CPC ........... H01L 27/0924; H01L 29/41791; H01L 29/45; H01L 29/66795; H01L 29/785; H01L 29/42392; H10D 64/01; H10D 30/024; H10D 30/62; H10D 30/6219; H10D 64/62; H10D 84/017; H10D 84/0186; H10D 84/0193; H10D 84/038; H10D 84/853
See application file for complete search history.

(56) References Cited

U.S. PATENT DOCUMENTS 9,768,077 B1 * 9/2017 Adusumilli ....... H01L 21/32115
2005/0250301 A1 * 11/2005 Cabral .............. H01L 21/28052
438/606
(Continued)

*Primary Examiner* — Jarrett J Stark
(74) *Attorney, Agent, or Firm* — Schwabe, Williamson & Wyatt P.C.

(57) ABSTRACT

Embodiments disclosed herein include complementary metal-oxide-semiconductor (CMOS) devices and methods of making such devices. In an embodiment, a CMOS device comprises a first transistor with a first conductivity type, where the first transistor comprises a first source region and a first drain region, and a first interface material over the first source region and the first drain region. In an embodiment, the CMOS device further comprises a second transistor with a second conductivity type that is opposite form the first conductivity type, where the second transistor comprises a second source region and a second drain region, and a second interface material over the second source region and the second drain region.

17 Claims, 14 Drawing Sheets

(51) Int. Cl.
  *H10D 84/03*   (2025.01)
  *H10D 84/85*   (2025.01)

(56)            References Cited

U.S. PATENT DOCUMENTS

2007/0040225  A1*   2/2007  Yang .................. H01L 29/7848
                                                      257/E21.199
2009/0184341  A1*   7/2009  Chong ........... H01L 21/823814
                                                      257/190
2009/0280630  A1*  11/2009  Chin .................. H01L 29/4966
                                                      438/530
2011/0062526  A1*   3/2011  Xu ................. H01L 21/823835
                                                      257/369
2014/0273366  A1*   9/2014  Lin .................. H01L 21/28518
                                                      257/369
2018/0233505  A1*   8/2018  Mulfinger ........... H01L 27/0924
2018/0261598  A1*   9/2018  Adusumilli ....... H01L 21/02667
2018/0277541  A1*   9/2018  Gluschenkov ...... H01L 27/0924
2019/0348498  A1*  11/2019  Cheng .............. H01L 29/66795
2020/0343373  A1*  10/2020  Tsai ................. H01L 21/76224
2021/0104524  A1*   4/2021  Hwang .............. H01L 29/0847
2021/0399098  A1*  12/2021  Li .................... H01L 23/53228
2023/0402546  A1*  12/2023  Yu .................... H01L 29/41733

* cited by examiner

DUAL CONTACT PROCESS WITH SELECTIVE DEPOSITION

TECHNICAL FIELD

Embodiments of the present disclosure relate to semiconductor devices, and more particularly to CMOS devices with a P-type source/drain region covered by a germanium layer and an N-type source/drain region covered by a TiSi layer.

BACKGROUND

Resistance in a transistor is undesirable because it reduces drive current and reduces efficiency. As such, high resistance transistors result in degraded performance. The interface between metal and semiconductor is a key source of undesired resistance through a transistor. Selecting the proper metal materials to decrease the resistance is not without issue. Particularly, in a complementary metal-oxide-semiconductor (CMOS) device, there are N-type source/drain regions and P-type source/drain regions. To minimize resistance in both conductivity types, different metals would be required.

Currently, there are several options that may be used to reduce the resistance at the metal-semiconductor interface in CMOS devices. One solution is to use a compromise approach, where the metal chosen yields a good resistance value for one type of source/drain region. However, such embodiments result in the other type of source/drain region resulting in a higher resistance. Another solution is to increase the doping level of the source/drain regions. However, doping cannot be increased endlessly. At high doping concentrations, the dopants begin to form clusters instead of distributing evenly through the semiconductor. High dopant concentrations also may result in diffusion into the channel, which increases off-state current. Yet another solution is to insert a layer of germanium over the P-type source/drain regions. However, if germanium is deposited on top of the P-type source/drain regions and no further treatment is done to the N-type source/drain region, then the heights of the PMOS and NMOS contacts will be very different. This impacts the yield, especially in a self-aligned gate electrode (SAGE) architecture, where the contact height needs to be carefully controlled to prevent open and short circuits.

EMBODIMENTS OF THE PRESENT DISCLOSURE

Figure 1A:
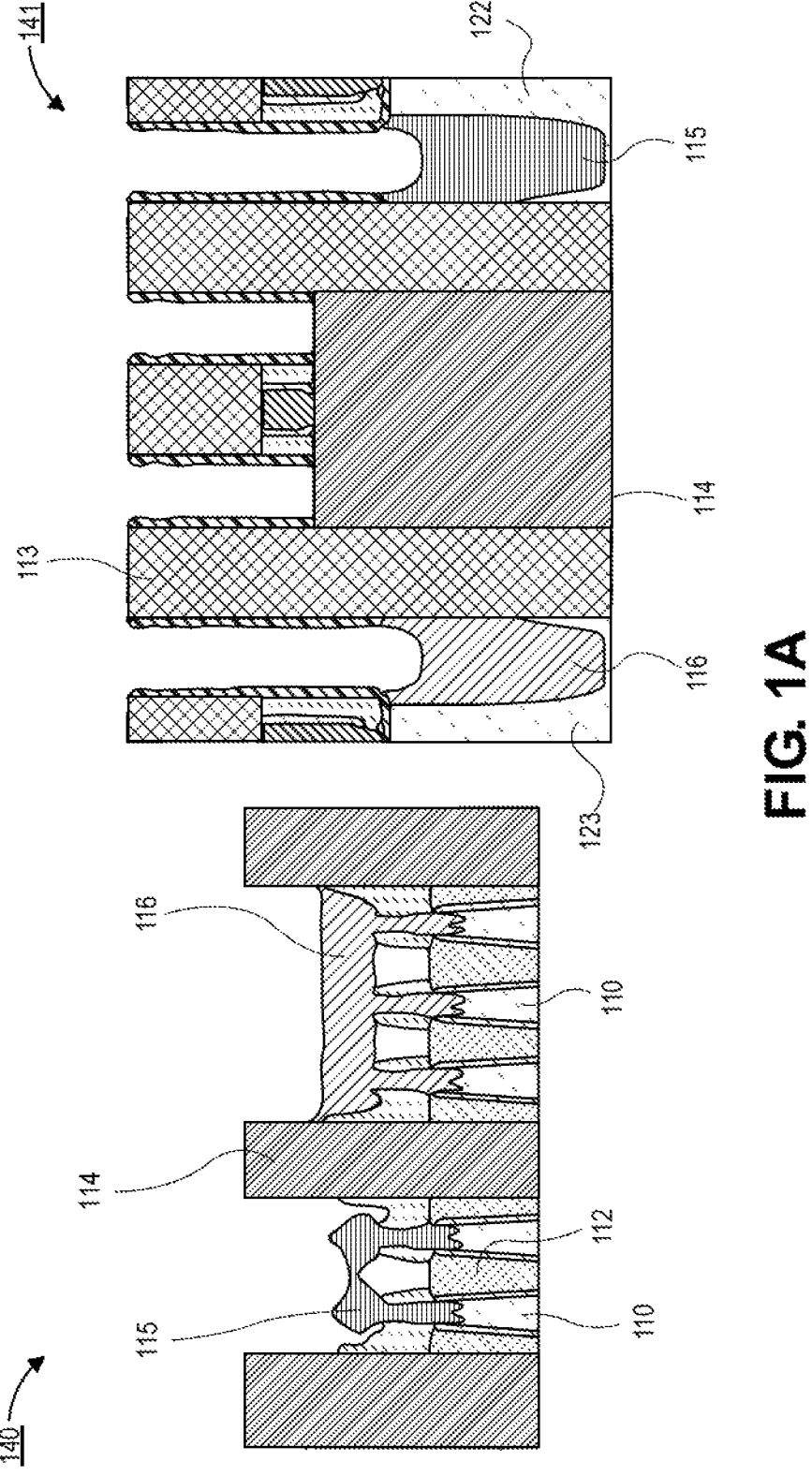
FIG. 1A is a pair of cross-sectional illustrations of a CMOS device with a P-type transistor and an N-type transistor, in accordance with an embodiment.

Described herein are CMOS devices with a P-type source/drain region covered by a germanium layer and an N-type source/drain region covered by a TiSi layer, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, the reduction of resistance within transistors allows for improved drive current. A relatively significant source of the resistance in the transistors is at the interface between the epitaxially grown source/drain region (a semiconductor) and the metal contact. The resistance at the semiconductor-metal interface may be minimized through selecting compatible materials that reduce the Schottky barrier at the interface. In complimentary metal-oxide-semiconductor (CMOS) devices, N-type source/drain regions and P-type source/drain regions are included in the device. The materials for minimizing the resistance of the N-type source/drain regions and the P-type source/drain regions are different. Accordingly, in existing solutions, a compromise of the performance of one of the source/drain regions is necessary.

Accordingly, embodiments disclosed herein include a CMOS device that provides a first interface layer over the P-type source/drain regions and a second interface layer over the N-type source/drain regions. In a particular embodiment, the first interface layer comprises germanium, and the second interface material comprises TiSi. The inclusion of an interface material over both the P-type source/drain regions and the N-type source/drain regions allows for the contact height to remain uniform. As such, yield is improved since it is easier to control the contact height to minimize opens and/or short circuits.

As those skilled in the art will appreciate, the processes disclosed herein may be implemented on any non-planar transistor architecture. For example, in FIGS. 1A-1F, a tri-gate transistor architecture with optimized contact interfaces for the P-type and N-type source/drain regions is shown. Additionally, FIGS. 2A-2F illustrate a gate-all-around (GAA) architecture with optimized contact interfaces for the P-type and N-type source/drain regions.

Referring now to FIG. 1A, a pair of cross-sectional illustrations of a CMOS device are shown, in accordance with an embodiment. Cross-section 140 is a fin cut centered on the source/drain regions 115 and 116. That is, the fins 110 extend into and out of the plane of FIG. 1A. Cross-section 141 is a poly cut centered on a fin. As shown, the first source/drain region 115 is adjacent to a channel region 122, and the second source/drain region 116 is adjacent to a channel region 123.

In an embodiment, first source/drain region 115 may be a first conductivity type, and second source/drain region 116 may be a second conductivity type that is opposite from the first conductivity type. For example, the first source/drain region 115 may be P-type, and the second source/drain region may be N-type. In the illustrated embodiment, the first source/drain region 115 couples together a first number of fins 110, and the second source/drain region 116 couples together a second number of fins 110. In an embodiment, the first number of fins 110 may be different than the second number of fins 110, or the first number of fins 110 may be the same as the second number of fins 110. In the particular embodiment illustrated in FIG. 1A, the first number of fins 110 is two, and the second number of fins is three. However, it is to be appreciated that the first number of fins 110 and the second number of fins 110 may comprise any number of fins 110.

In an embodiment, the fins 110 may be high aspect ratio fins that extend up from a substrate (not shown). The fins 110 and the substrate may be semiconductor material, such as silicon, or any other suitable semiconductor material (e.g., a group III-V semiconductor material). The fins may have a tapered profile in some embodiments. That is, a bottom of the fin 110 may be wider than a top of the fin 110. In an embodiment, the fins 110 may be separated from each other by an isolation layer 112. The isolation layer 112 may extend up from the substrate (not shown). The top of the isolation layer 112 may be recessed below a top of the fins 110.

In an embodiment, the first source/drain region 115 may be an epitaxially grown semiconductor material that is grown over a top surface of the fins 110. In the case of multiple fins 110, the source/drain region 115 may merge together in order to electrically couple the fins 110 together.

For example, two fins 110 are electrically coupled by the first source/drain region 115. Similarly, three fins 110 are electrically coupled by the second source/drain region 116. In an embodiment, the shapes of the source/drain regions 115 and 116 may be dependent on the conductivity type of the source/drain region 115 or 116. For example, when the first source/drain region 115 is a P-type material, the first source/drain region 115 may have a diamond like shape over each fin 110. When the second source/drain region 116 is an N-type material, the second source/drain region 116 may have a substantially planar top surface.

In an embodiment, the first source/drain region 115 may be separated from the second source/drain region 116 by an isolator 114. The isolator 114 may comprise an insulator filled trench that extends down between the fins 110. In cross-section 141, an isolator 114 is shown between the ends of the first source/drain region 115 and the second source/drain region 116. The isolator 114 may be between isolation regions 113.

Figure 1B:
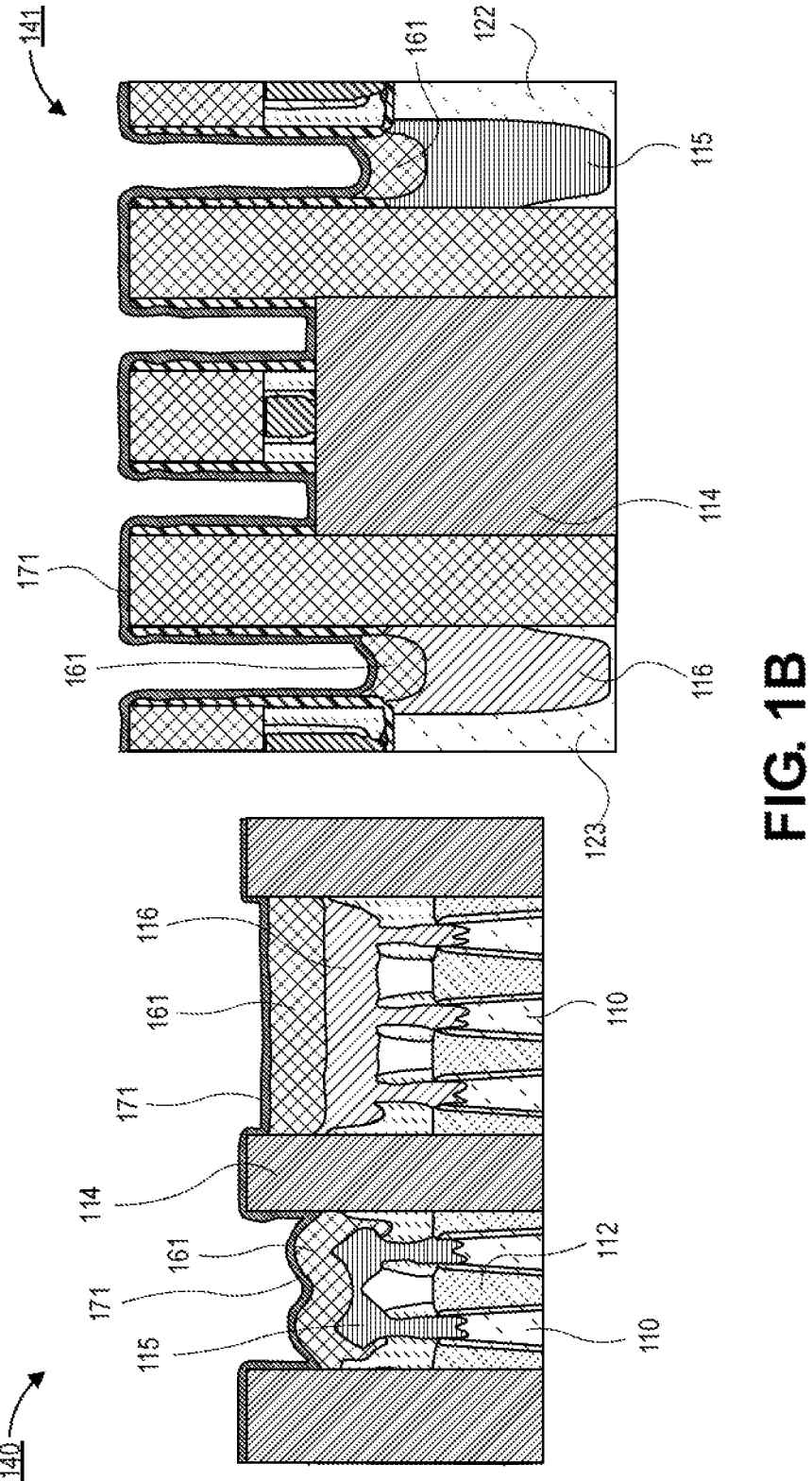
FIG. 1B is a pair of cross-sectional illustrations of the CMOS device after a first interface layer is disposed over the first and second source/drain regions, in accordance with an embodiment.

Referring now to FIG. 1B, a pair of cross-sectional illustrations 140 and 141 of the CMOS device after a first interface layer 161 is disposed over the exposed surfaces is shown, in accordance with an embodiment. In an embodiment, the first interface layer 161 may be a material that is selected to provide a relatively low resistance interface between the first source/drain region 115 and the first interface layer 161. In an embodiment, where the first source/drain region 115 is a P-type semiconductor, the first interface layer 161 may comprise germanium. In a particular embodiment, the first interface layer 161 may be a boron doped germanium material. However, it is to be appreciated that other materials (e.g., semiconductors or metals) may also be used as the first interface layer 161, depending on the conductivity type, dopant concentration, etc. of the first source/drain region 115.

In an embodiment, the first interface layer 161 may be grown with an epitaxial growth process. As such, the first interface layer 161 may be disposed over exposed semiconductor materials of the first source/drain region 115 and the second source/drain region 116. In an embodiment, the first interface layer 161 may have a thickness that is between approximately 0 nm and approximately 10 nm. In a particular embodiment, the thickness of the first interface layer 161 may be between approximately 3 nm and approximately 7 nm.

In an embodiment, a protective layer 171 may be disposed over the first interface layer 161. The protective layer 171 may be an oxide, a nitride, or the like. In a particular embodiment, the protective layer 171 is deposited with a conformal deposition process. The conformal deposition process may include an atomic layer deposition (ALD) process.

Figure 1C:
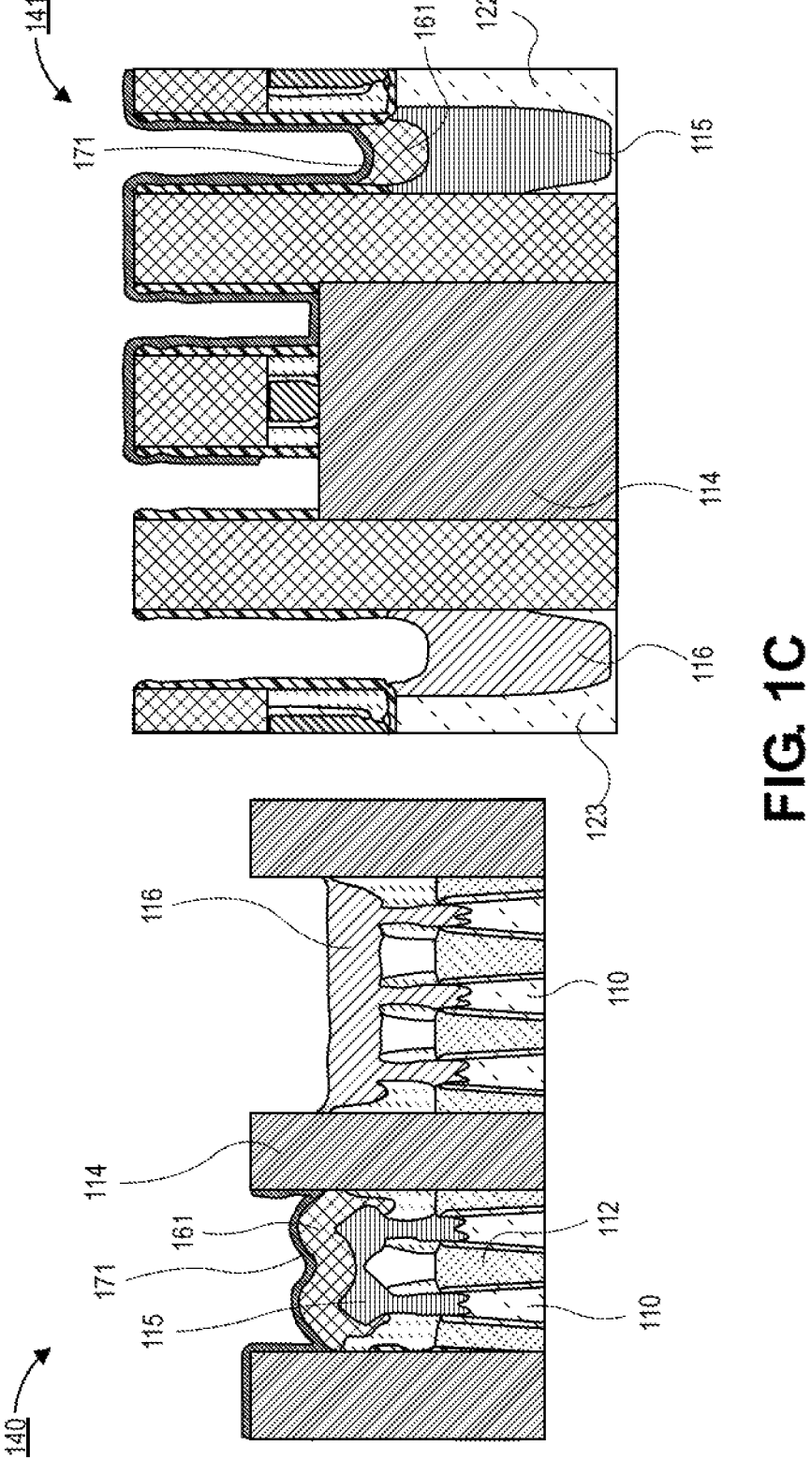
FIG. 1C is a pair of cross-sectional illustrations of the CMOS device after the first interface layer is selectively removed from over the second source/drain region, in accordance with an embodiment.

Referring now to FIG. 1C, a pair of cross-sectional illustrations 140 and 141 of the CMOS device after the first interface layer 161 and the protective layer 171 is removed from over the second source/drain region 116 is shown, in accordance with an embodiment. The selective removal of portions of the protective layer 171 and the first interface layer 161 may be implemented using a lithography and etching process. For example, a mask (e.g., a carbon hardmask) may be deposited and patterned to form an opening over the second source/drain region 116 while protecting the first source/drain region 115. An etching process (e.g., a wet etch) may then be used to remove the protective layer 171 and the first interface layer 161. The mask may then be removed with an ashing process, or the like.

Figure 1D:
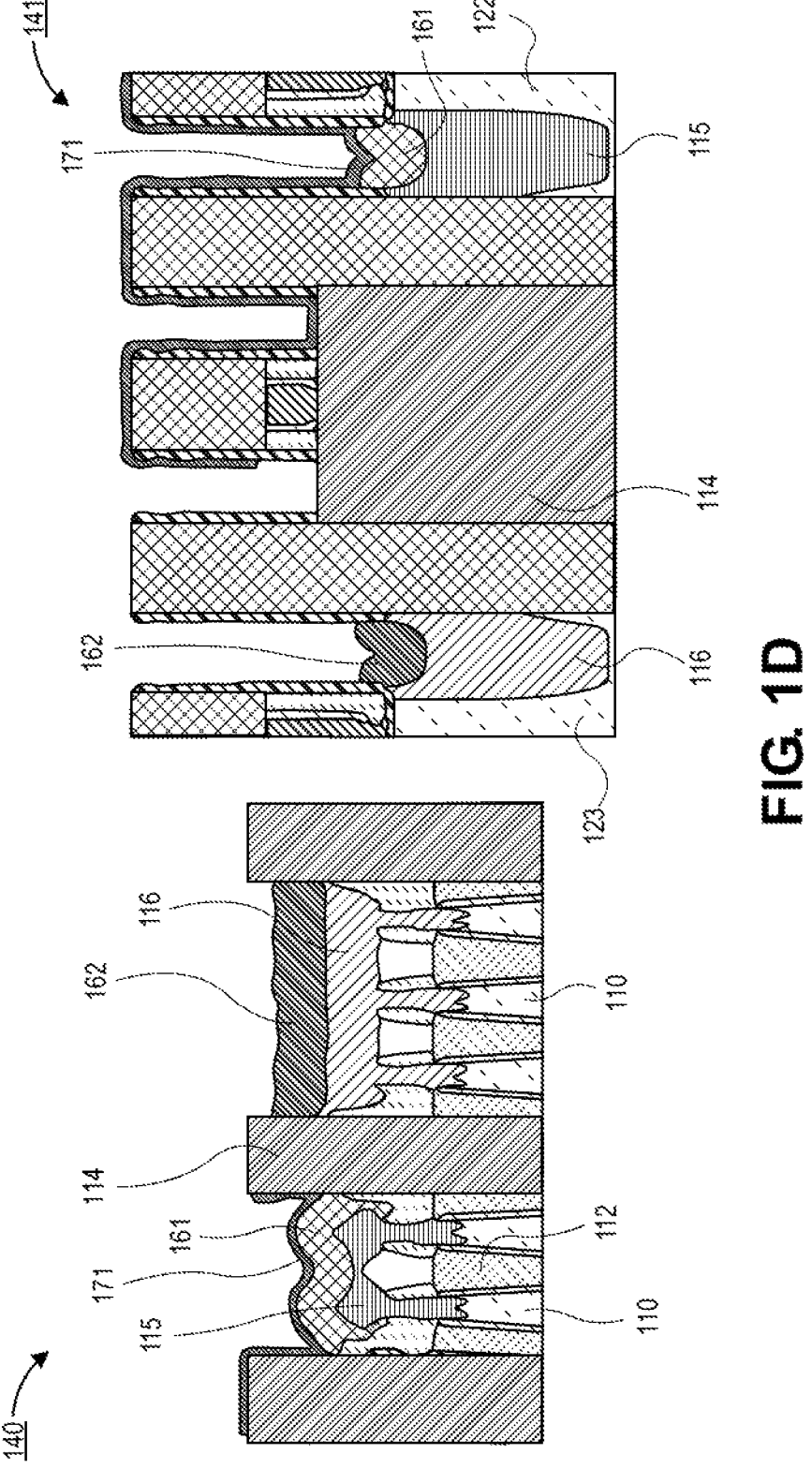
FIG. 1D is a pair of cross-sectional illustrations of the CMOS device after a second interface layer is selectively deposited over the second source/drain region, in accordance with an embodiment.

Referring now to FIG. 1D, a pair of cross-sectional illustrations 140 and 141 of the CMOS device after a second interface layer 162 is formed is shown, in accordance with an embodiment. In an embodiment, the second interface layer 162 may be selectively deposited over the second source/drain region 116. For example, a selective chemical vapor deposition (CVD) process that deposits on the exposed semiconductor of the second source/drain region 116 may be used. The selective CVD process may not deposit on dielectric materials, such as the protective layer 171.

In an embodiment, the second interface layer 162 may comprise a material that reduces the resistance at the interface between the second interface layer 162 and the second source/drain region 116. For example, the second interface layer 162 may comprise TiSi. In an embodiment, the second interface layer 162 may have a thickness that is between approximately 0 nm and approximately 10 nm. In a particular embodiment, the thickness of the second interface layer 162 may be between approximately 3 nm and approximately 7 nm. In order to provide improved contact height uniformity between the PMOS device and the NMOS device, a first thickness of the first interface layer 161 may be substantially similar to a second thickness of the second interface layer 162.

Figure 1E:
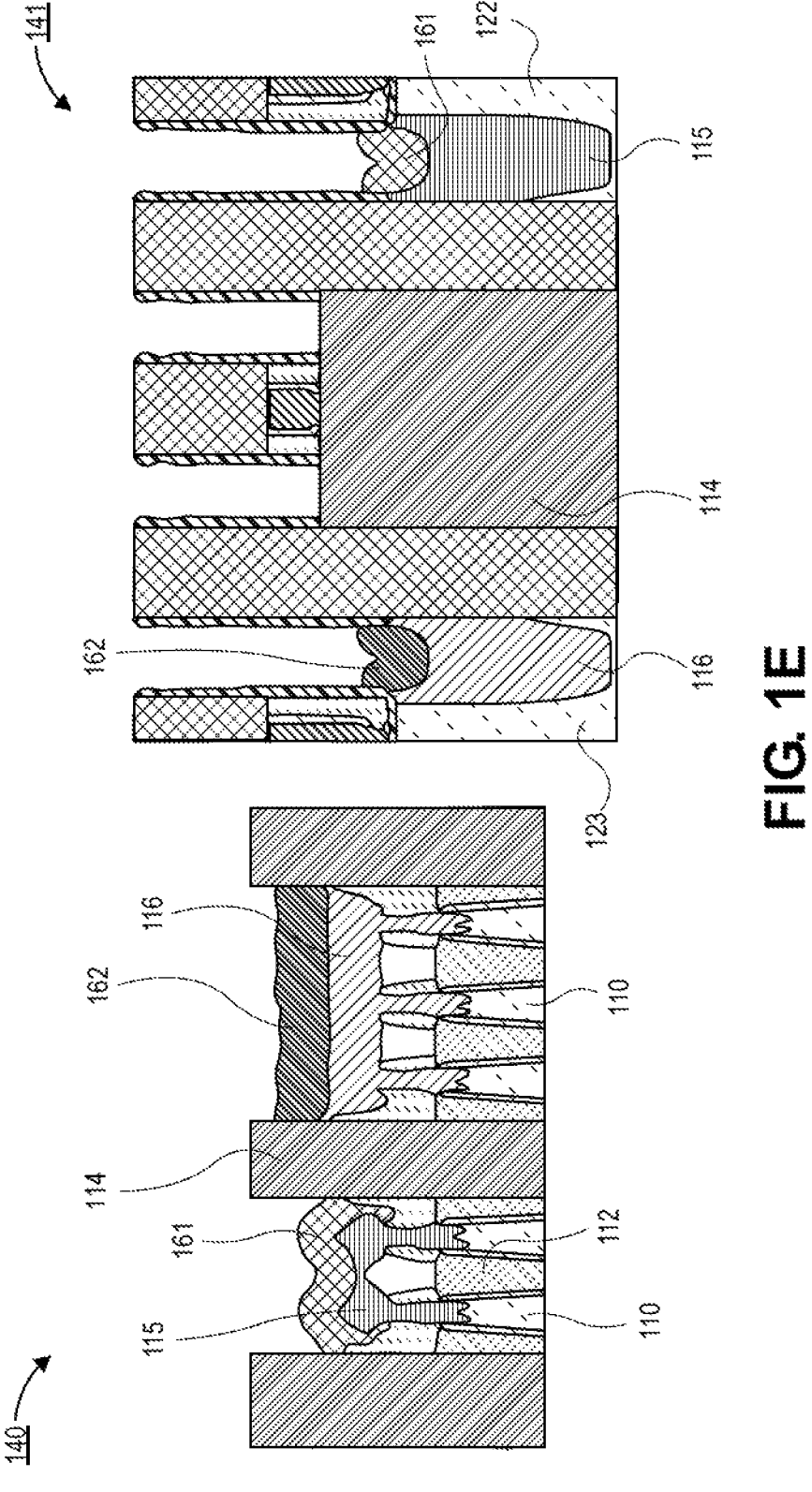
FIG. 1E is a pair of cross-sectional illustrations of the CMOS device after a protective layer over the first interface layer is removed, in accordance with an embodiment.

Referring now to FIG. 1E, a pair of cross-sectional illustrations 140 and 141 of the CMOS device after the protective layer 171 is removed is shown, in accordance with an embodiment. In an embodiment, the protective layer 171 may be removed with an etching process, such as a wet etching process.

Figure 1F:
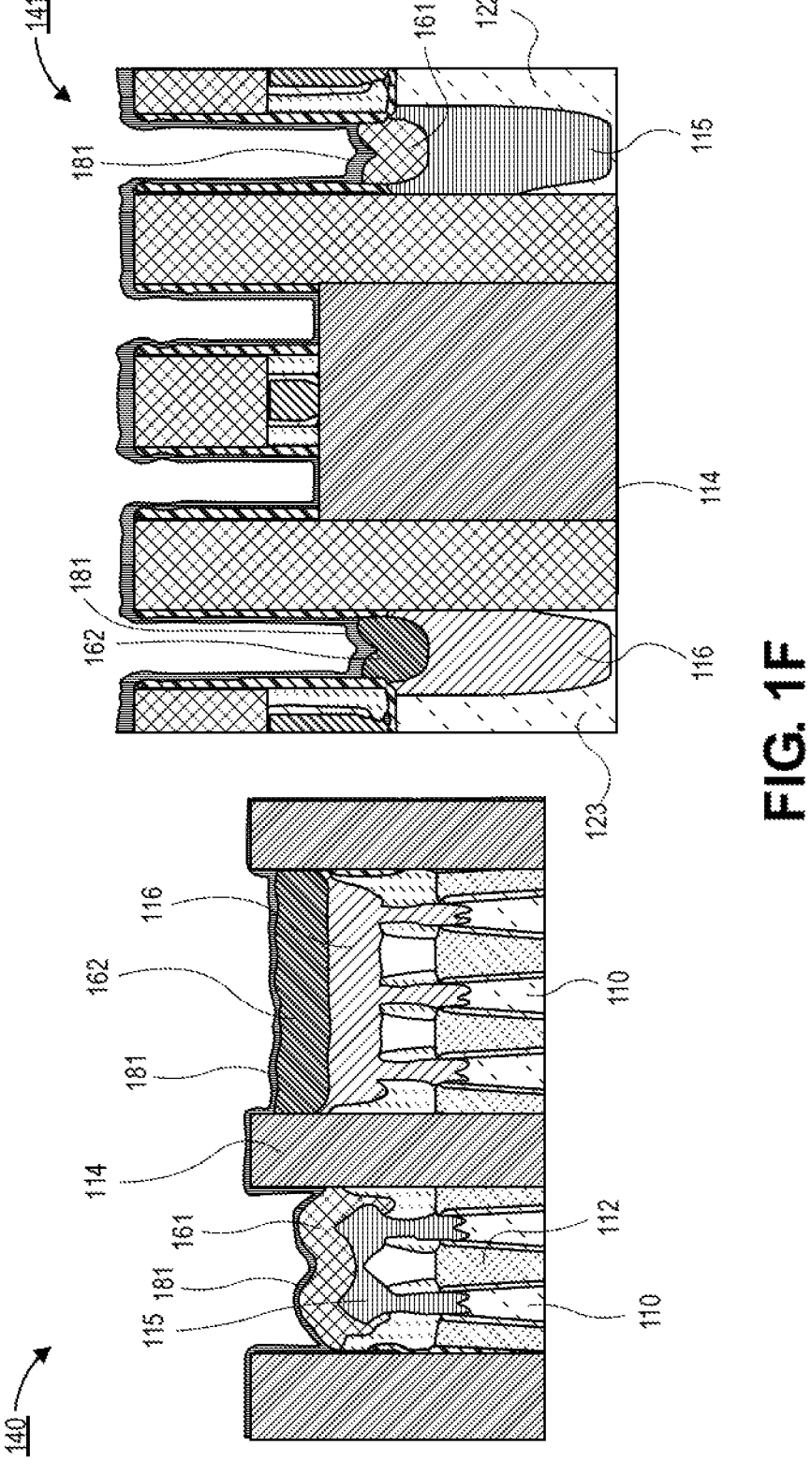
FIG. 1F is a pair of cross-sectional illustrations of the CMOS device after a contact metal is disposed over the first interface layer and the second interface layer, in accordance with an embodiment.

Referring now to FIG. 1F, a pair of cross-sectional illustrations 140 and 141 of the CMOS device after a contact layer 181 is provided over the interface layers 161 and 162 is shown, in accordance with an embodiment. In the illustrated embodiment, the contact layer 181 is shown as a thin layer that is conformally deposited. Those skilled in the art will appreciate that a contact fill material may be deposited to fill the trenches. Such a contact fill material may be recessed using existing downstream processes, as is common in the art. In an embodiment, the contact layer 181 may comprise tungsten or any other suitable metal.

The structure disclosed in the processing operations described in FIGS. 1A-1F provide a clearly discernable structure that can be identified using various analysis techniques. Particularly, TEM and EDX analysis will show that the first source/drain region 115 has a first interface layer 161 between the first source/drain region 115 and the contact 181, and the second source/drain region 116 has a second (different) interface layer 162 between the second source/drain region 116 and the contact 181. Additionally, such analysis may be used to show that a first thickness of the first interface layer 161 is substantially similar to a second thickness of the second interface layer 162.

Additionally, while shown with the first interface layer 161 being deposited first, followed by the second interface layer 162, embodiments are not limited to such process flows. Instead, the second interface layer 162 may be deposited first, the second interface layer 162 may be removed from the first source/drain region 115, and the first interface layer 161 may be deposited over the first source/drain region 115.

In FIGS. 1A-1F the processing operations are implemented on a tri-gate transistor structure. However, it is to be appreciated that embodiments are not limited to such configurations. For example, gate-all-around (GAA) structures may also benefit from embodiments disclosed herein.

Referring now to FIGS. 2A-2F, sets of cross-sectional illustrations of a CMOS device with a GAA architecture are shown. In FIGS. 2A-2F, a process is shown that allows for the reduction of the contact resistance by optimizing the material interfaces of both the P-type source/drain region and the N-type source/drain region while keeping a uniform contact height. In FIGS. 2A-2F, cross-section 250 is a fin cut centered on the source/drain regions 215 and 216, the cross-section 251 is a gate cut centered on the second source/drain region 216, and the cross-section 252 is a gate cut centered on the first source/drain region 215.

Figure 2A:
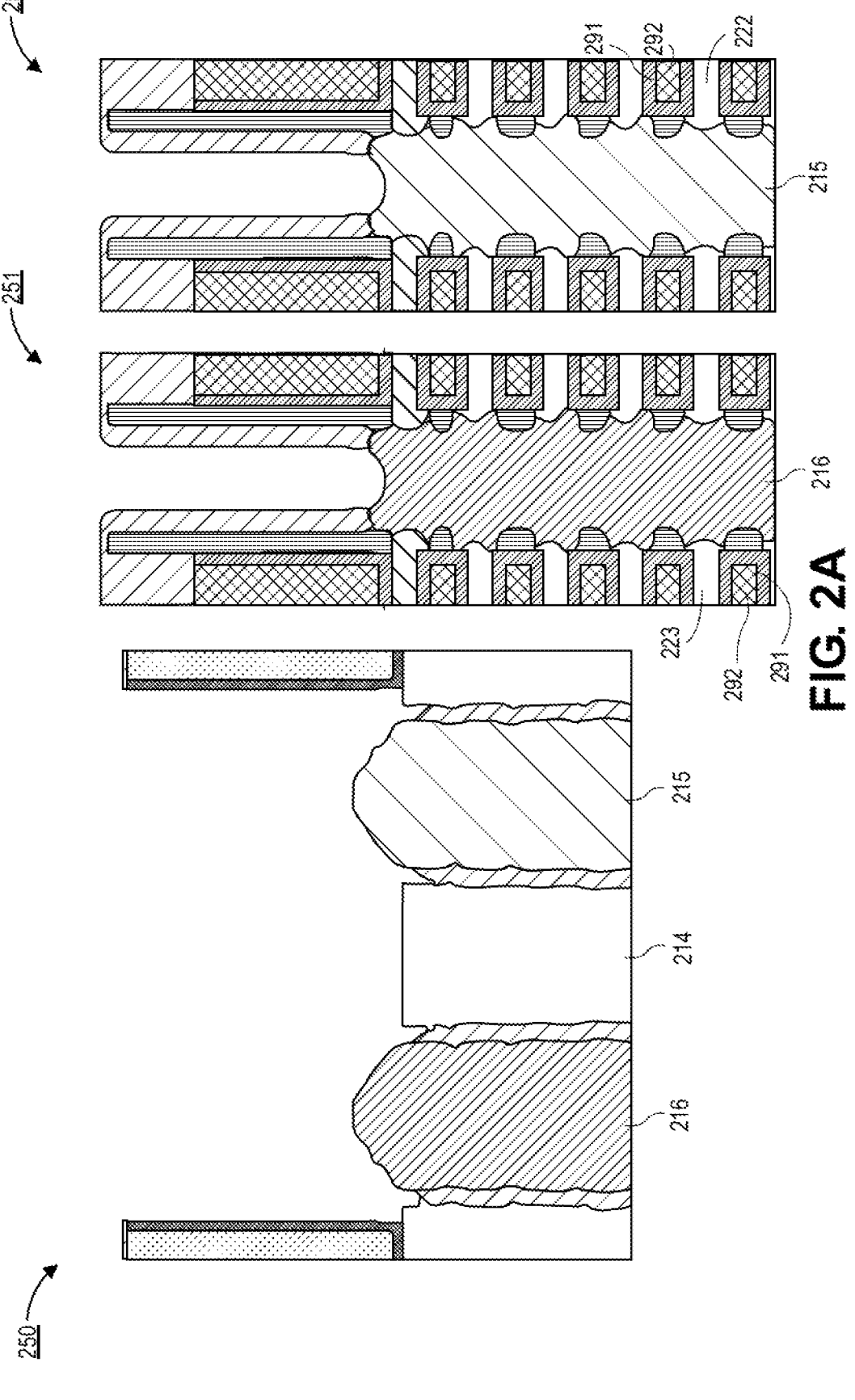
FIG. 2A is a set of cross-sectional illustrations of a CMOS device that includes a gate-all-around (GAA) structure, in accordance with an embodiment.

Referring now to FIG. 2A, a set of cross-sectional illustrations 250, 251, and 252 of a GAA CMOS device is shown, in accordance with an embodiment. As shown in cross-section 250, a first source/drain region 215 is separated from a second source/drain region 216 by an isolator 214. As shown, in cross-sections 251 and 252, the source/drain regions 215 and 216 may be coupled to nanowires or nanoribbons 222/223. The nanowires or nanoribbons 222/223 may be surrounded by a gate dielectric 291 and a gate metal 292. The gate metal 292 may comprise a workfunction metal and a gate fill metal in some embodiments.

In an embodiment, the first source/drain region 215 may be a first conductivity type, and the second source/drain region 216 may be a second conductivity type that is opposite from the first conductivity type. For example, the first conductivity type may be P-type, and the second conductivity type may be N-type.

Figure 2B:
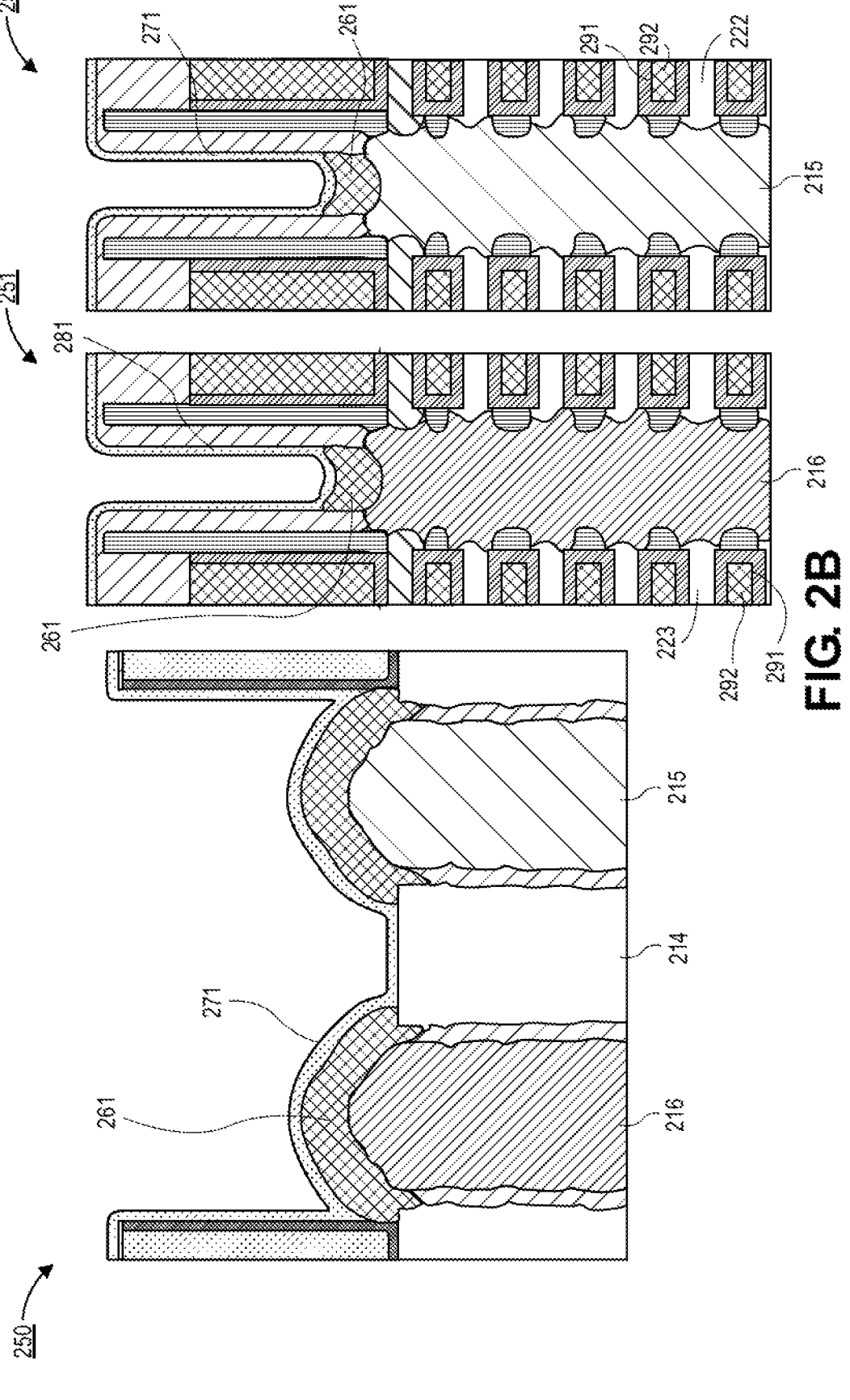
FIG. 2B is a set of cross-sectional illustrations of the CMOS device after a first interface layer is disposed over the first and second source/drain regions, in accordance with an embodiment.

Referring now to FIG. 2B, a set of cross-sectional illustrations 250, 251, and 252 of the CMOS device after a first interface layer 261 is deposited over the first source/drain region 215 and the second source/drain region 216 is shown, in accordance with an embodiment. In an embodiment, the first interface layer 261 may be a material that is selected to provide a relatively low resistance interface between the first source/drain region 215 and the first interface layer 261. In an embodiment, where the first source/drain region 215 is a P-type semiconductor, the first interface layer 261 may comprise germanium. In a particular embodiment, the first interface layer 261 may be a boron doped germanium material. However, it is to be appreciated that other materials (e.g., semiconductors or metals) may also be used as the first interface layer 261, depending on the conductivity type, dopant concentration, etc. of the first source/drain region 215.

In an embodiment, the first interface layer 261 may be grown with an epitaxial growth process. As such, the first interface layer 261 may be selectively disposed over exposed semiconductor materials of the first source/drain region 215 and the second source/drain region 216. In an embodiment, the first interface layer 261 may have a thickness that is between approximately 0 nm and approximately 10 nm. In a particular embodiment, the thickness of the first interface layer 261 may be between approximately 3 nm and approximately 7 nm.

In an embodiment, a protective layer 271 may be disposed over the first interface layer 261. The protective layer 271 may be an oxide, a nitride, or the like. In a particular embodiment, the protective layer 271 is deposited with a conformal deposition process. The conformal deposition process may include an atomic layer deposition (ALD) process.

Figure 2C:
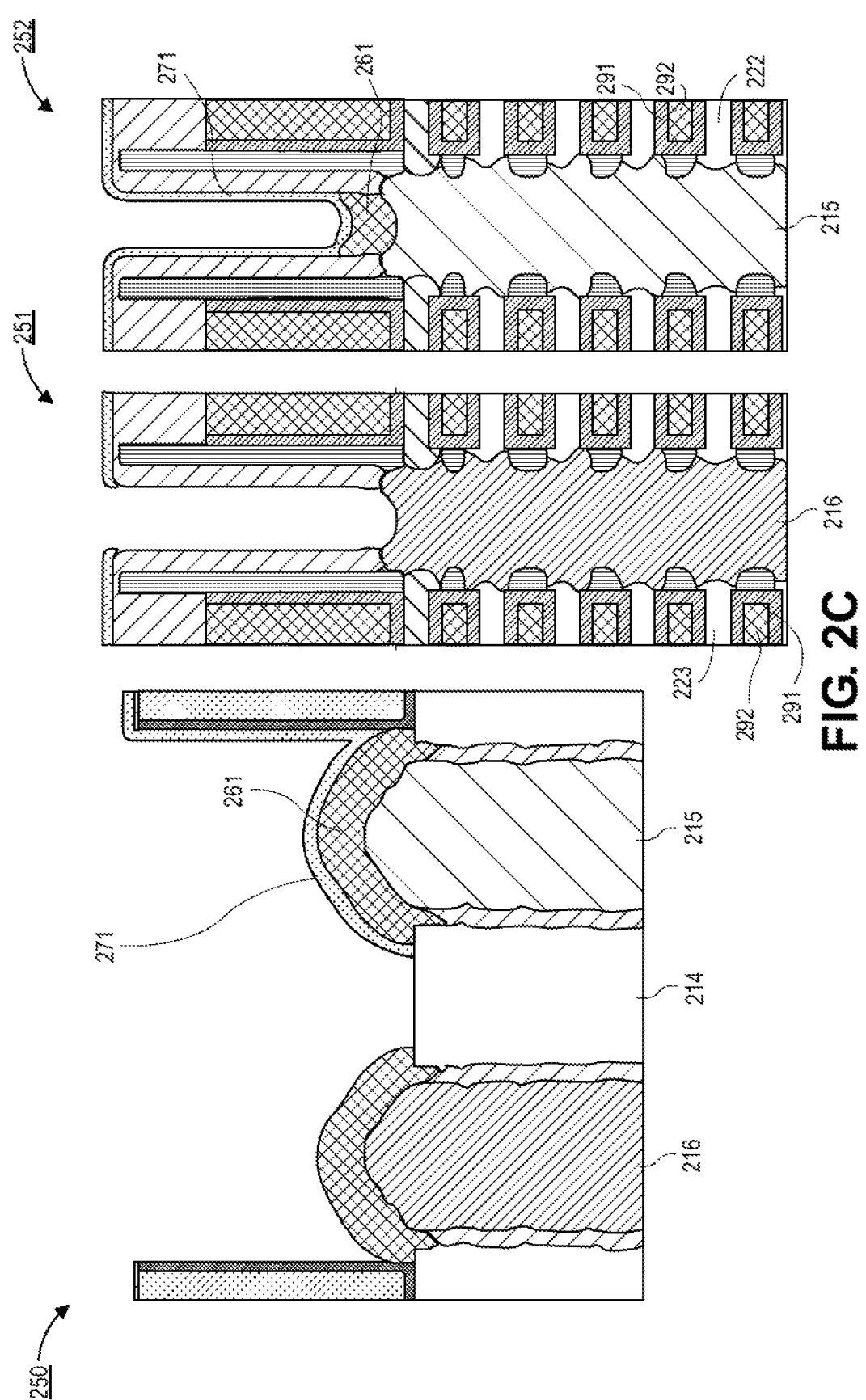
FIG. 2C is a set of cross-sectional illustrations of the CMOS device after the first interface layer is selectively removed from the second source/drain region, in accordance with an embodiment.

Referring now to FIG. 2C, a set of cross-sectional illustrations 250, 251, and 252 of the CMOS device after the first interface layer 261 is removed from the second source/drain region 216 is shown, in accordance with an embodiment. The selective removal of portions of the protective layer 271 and the first interface layer 261 may be implemented using a lithography and etching process. For example, a mask (e.g., a carbon hardmask) may be deposited and patterned to form an opening over the second source/drain region 216 while protecting the first source/drain region 215. An etching process (e.g., a wet etch) may then be used to remove the protective layer 271 and the first interface layer 261. The mask may then be removed with an ashing process, or the like.

Figure 2D:
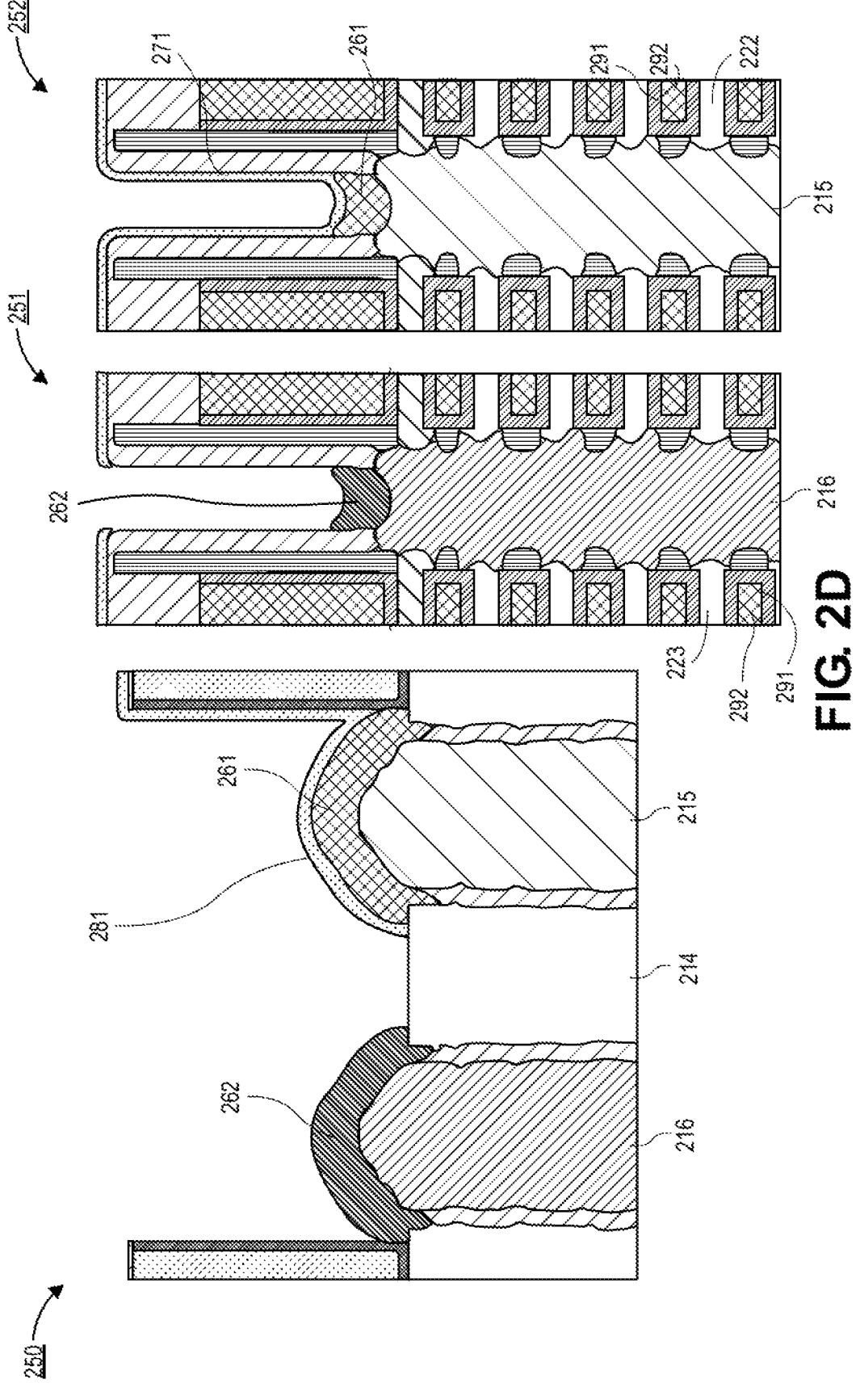
FIG. 2D is a set of cross-sectional illustrations of the CMOS device after a second interface layer is disposed over the second source/drain region, in accordance with an embodiment.

Referring now to FIG. 2D, a set of cross-sectional illustrations 250, 251, and 252 of the CMOS device after a second interface layer 262 is formed is shown, in accordance with an embodiment. In an embodiment, the second interface layer 262 may be selectively deposited over the second source/drain region 216. For example, a selective chemical vapor deposition (CVD) process that deposits on the exposed semiconductor of the second source/drain region may be used. The selective CVD process may not deposit on dielectric materials, such as the protective layer 271.

In an embodiment, the second interface layer 262 may comprise a material that reduces the resistance at the interface between the second interface layer 262 and the second source/drain region 216. For example, the second interface layer 262 may comprise TiSi. In an embodiment, the second interface layer 262 may have a thickness that is between approximately 0 nm and approximately 10 nm. In a particular embodiment, the thickness of the second interface layer 262 may be between approximately 3 nm and approximately 7 nm. In order to provide improved contact height uniformity between the PMOS device and the NMOS device, a first thickness of the first interface layer 261 may be substantially similar to a second thickness of the second interface layer 262.

Figure 2E:
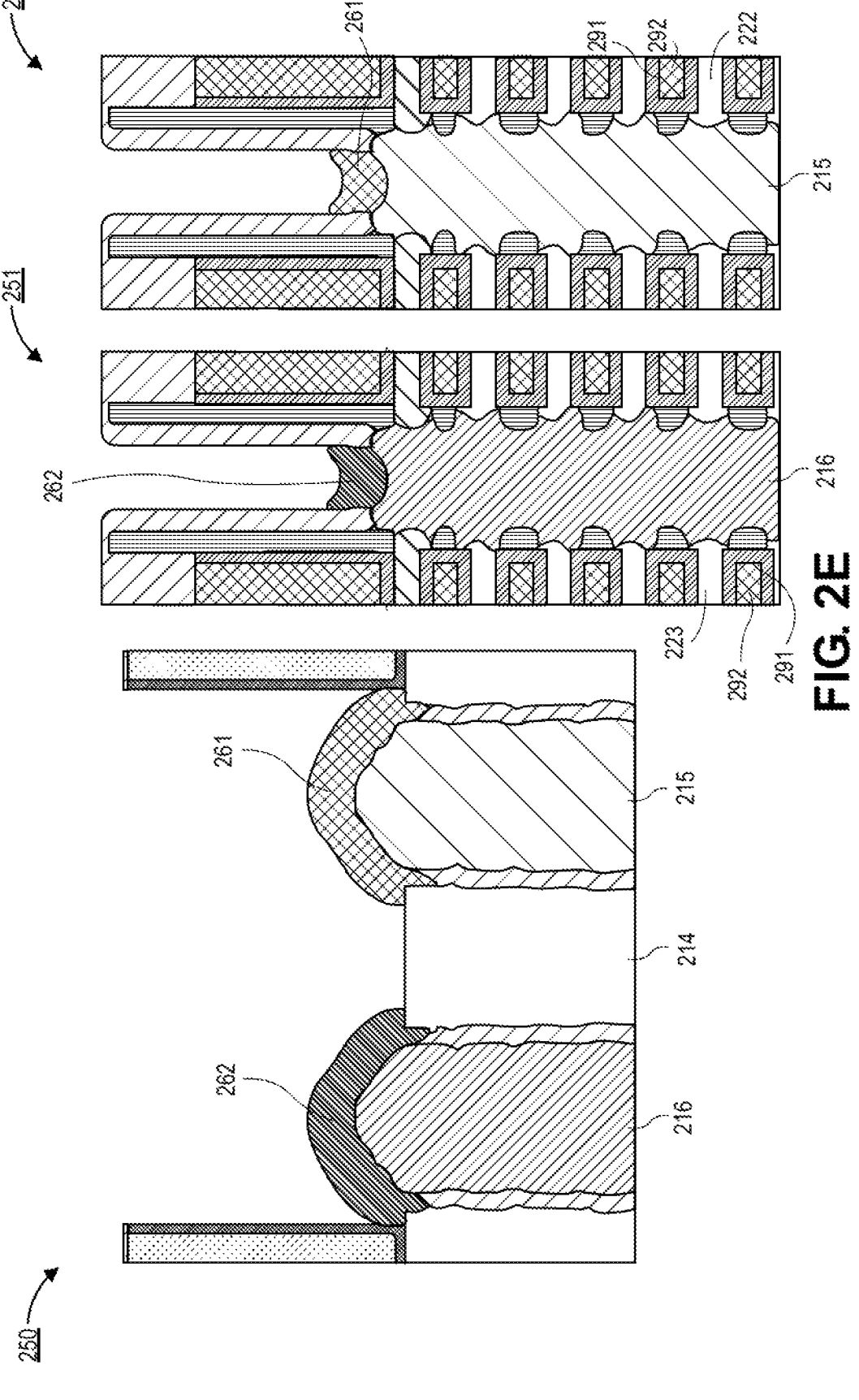
FIG. 2E is a set of cross-sectional illustrations of the CMOS device after a protective layer over the first interface layer is removed, in accordance with an embodiment.

Referring now to FIG. 2E, a set of cross-sectional illustrations 250, 251, and 252 of the CMOS device after the protective layer 271 is removed is shown, in accordance with an embodiment. In an embodiment, the protective layer 271 may be removed with an etching process, such as a wet etching process.

Figure 2F:
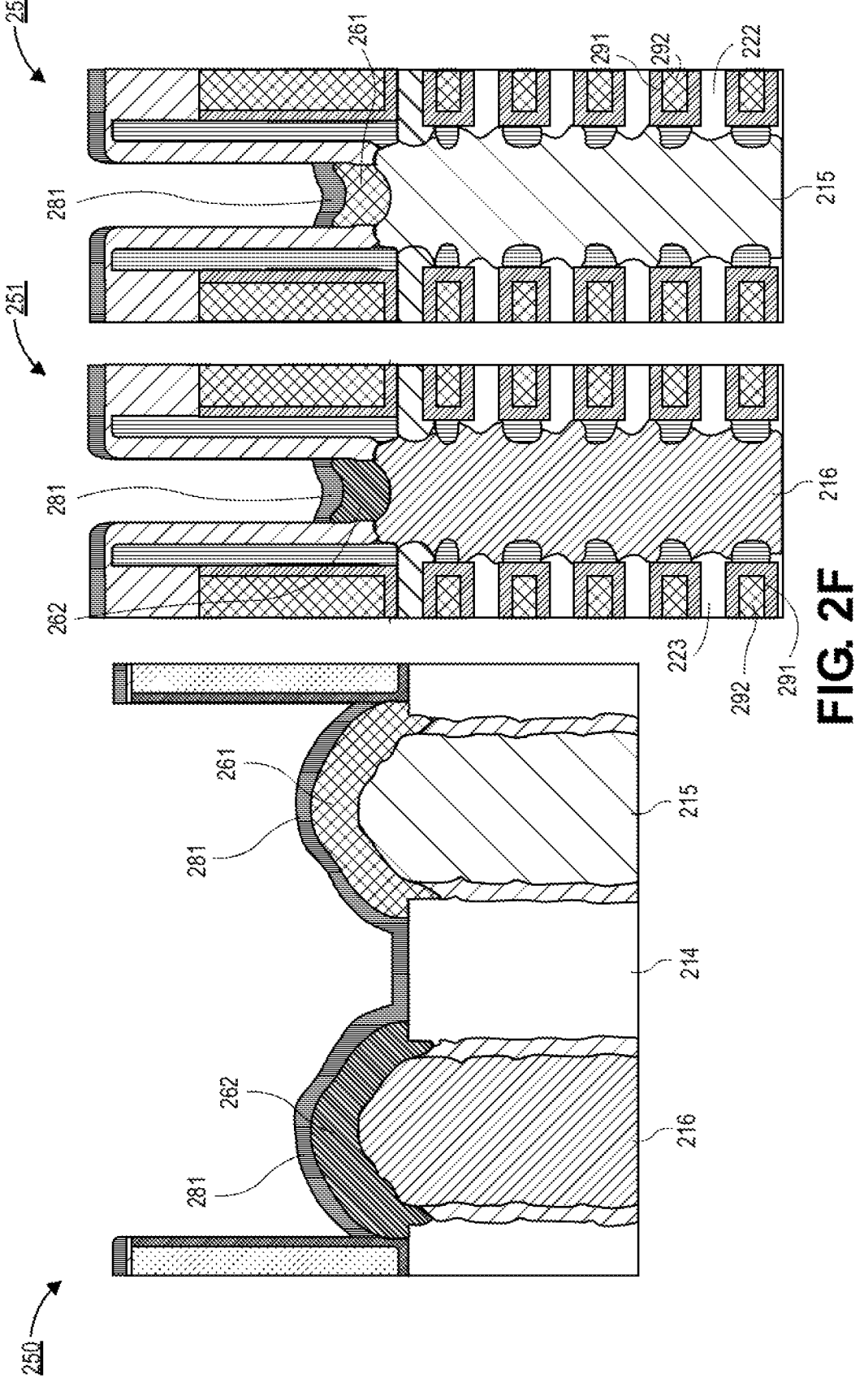
FIG. 2F is a set of cross-sectional illustrations of the CMOS device after a contact layer is disposed over the first interface layer and the second interface layer, in accordance with an embodiment.

Referring now to FIG. 2F, a set of cross-sectional illustrations 250, 251, and 252 of the CMOS device after a contact layer 281 is provided over the interface layers 261 and 262 is shown, in accordance with an embodiment. In the illustrated embodiment, the contact layer 281 is shown as a thin layer that is conformally deposited. Those skilled in the art will appreciate that a contact fill material may be deposited to fill the trenches. Such a contact fill material may be recessed using existing downstream processes, as is common in the art. In an embodiment, the contact layer 181 may comprise tungsten or any other suitable metal.

The structure disclosed in the processing operations described in FIGS. 2A-2F provide a clearly discernable structure that can be identified using various analysis techniques. Particularly, TEM and EDX analysis will show that the first source/drain region 215 has a first interface layer 261 between the first source/drain region 215 and the contact 281, and the second source/drain region 216 has a second (different) interface layer 262 between the second source/drain region 216 and the contact 281. Additionally, such analysis may be used to show that a first thickness of the first interface layer 261 is substantially similar to a second thickness of the second interface layer 262.

Figure 3:
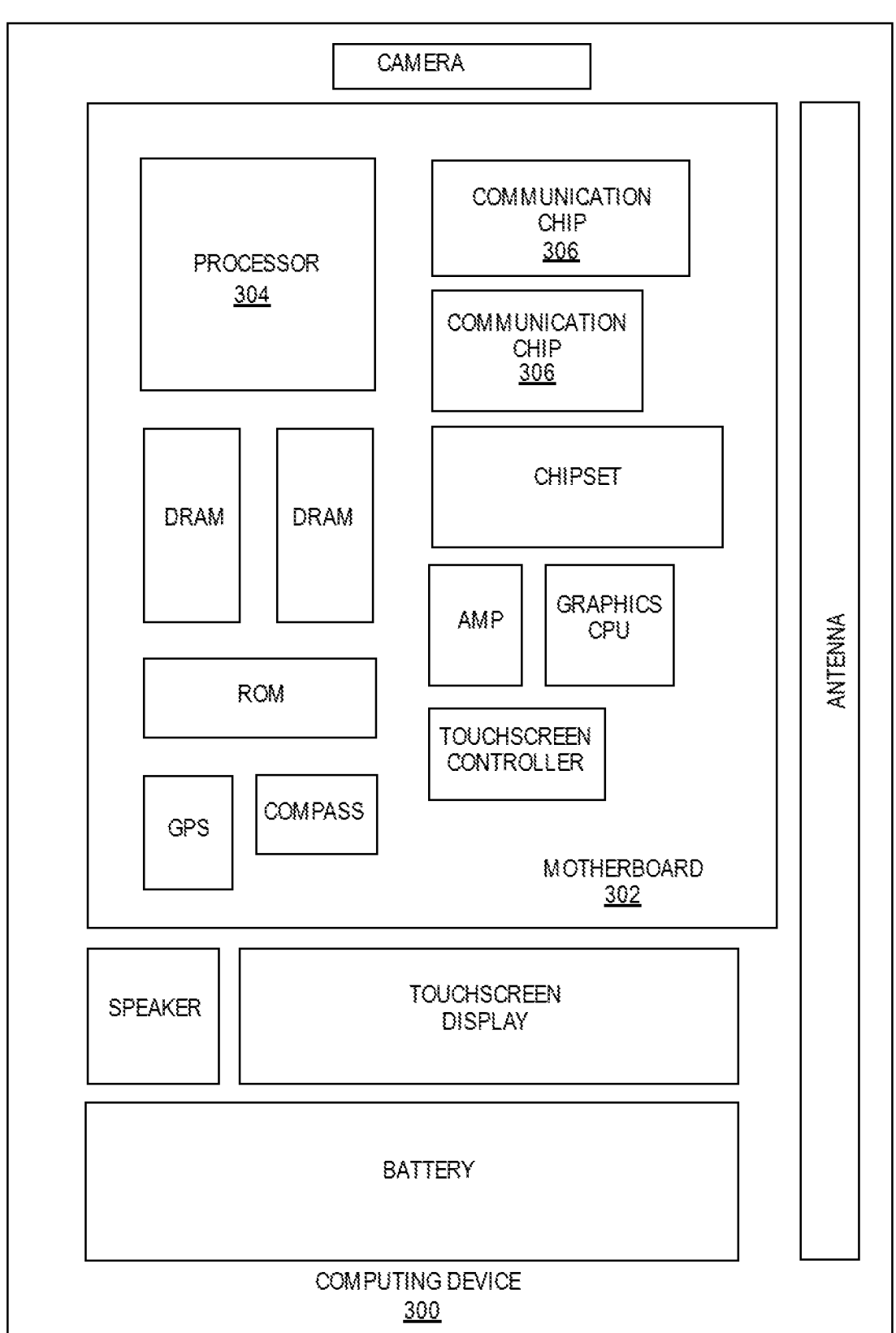
FIG. 3 illustrates a computing device in accordance with one implementation of an embodiment of the disclosure.

FIG. 3 illustrates a computing device 300 in accordance with one implementation of an embodiment of the disclosure. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In an embodiment, the integrated circuit die of the processor may comprise a CMOS device with optimized contact interfaces, where a first source/drain region is covered by a first interface layer, and a second source/drain region is covered by a second interface layer, such as those described herein. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In an embodiment, the integrated circuit die of the communication chip may comprise a CMOS device with optimized contact interfaces, where a first source/drain region is covered by a first interface layer, and a second source/drain region is covered by a second interface layer, such as those described herein.

In further implementations, another component housed within the computing device 300 may comprise a CMOS device with optimized contact interfaces, where a first source/drain region is covered by a first interface layer, and a second source/drain region is covered by a second interface layer, and a second source/drain region is covered by the second metal layer, such as those described herein.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

Figure 4:
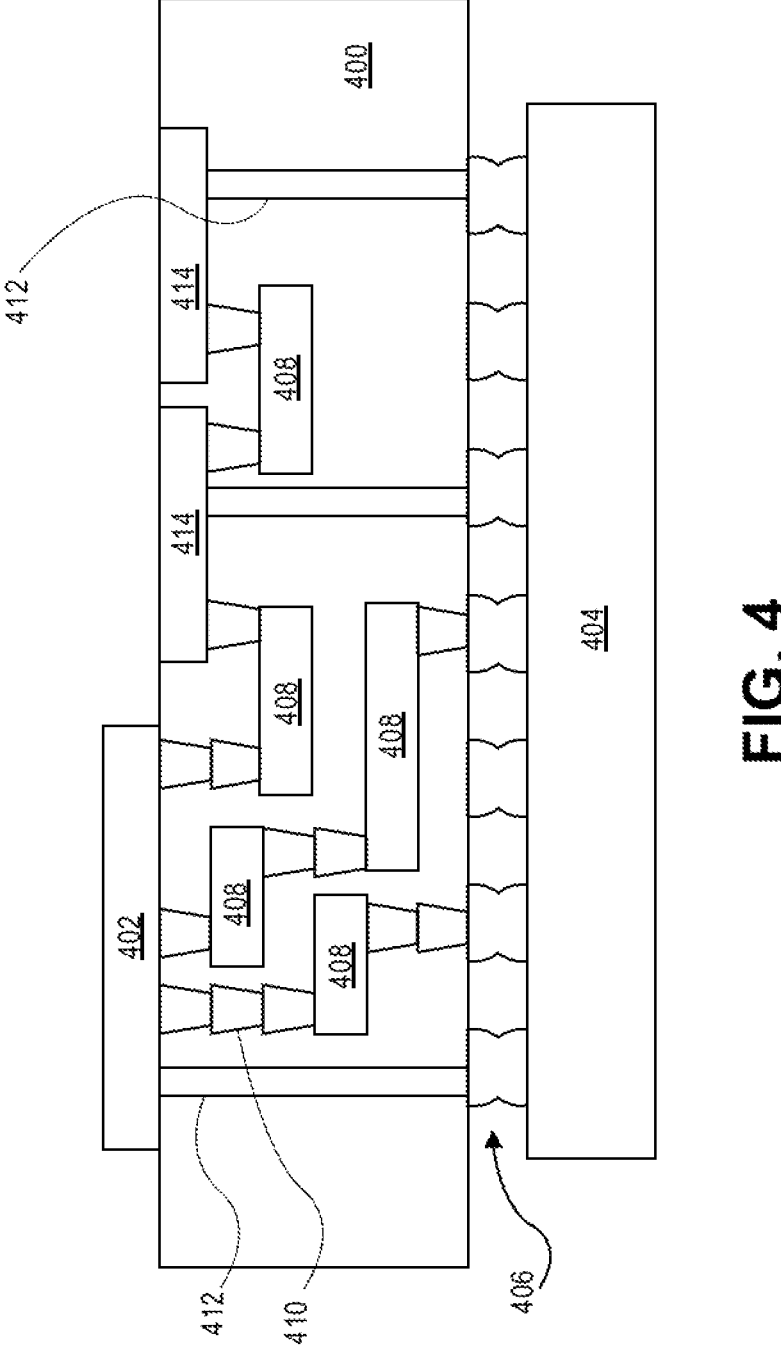
FIG. 4 is an interposer implementing one or more embodiments of the disclosure.

FIG. 4 illustrates an interposer 400 that includes one or more embodiments of the disclosure. The interposer 400 is an intervening substrate used to bridge a first substrate 402 to a second substrate 404. The first substrate 402 may be, for instance, an integrated circuit die. The second substrate 404 may be, for instance, a memory module, a computer motherboard, or another integrated circuit die. In an embodiment, one of both of the first substrate 402 and the second substrate 404 may comprise a CMOS device with optimized contact interfaces, where a first source/drain region is covered by a first interface layer, and a second source/drain region is covered by a second interface layer, in accordance with embodiments described herein. Generally, the purpose of an interposer 400 is to spread a connection to a wider pitch or to reroute a connection to a different connection. For example, an interposer 400 may couple an integrated circuit die to a ball grid array (BGA) 406 that can subsequently be coupled to the second substrate 404. In some embodiments, the first and second substrates 402/404 are attached to opposing sides of the interposer 400. In other embodiments, the first and second substrates 402/404 are attached to the same side of the interposer 400. And in further embodiments, three or more substrates are interconnected by way of the interposer 400.

The interposer 400 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials The interposer 400 may include metal interconnects 408 and vias 410, including but not limited to through-silicon vias (TSVs) 412. The interposer 400 may further include embedded devices 414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 400. In accordance with embodiments of the disclosure, apparatuses or processes disclosed herein may be used in the fabrication of interposer 400.

Thus, embodiments of the present disclosure may comprise a CMOS device with optimized contact interfaces, where a first source/drain region is covered by a first interface layer, and a second source/drain region is covered by a second interface layer, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a complementary metal-oxide-semiconductor (CMOS) device, comprising: a first transistor with a first conductivity type, wherein the first transistor comprises: a first source region and a first drain region; and a first interface material over the first source region and the first drain region; and a second transistor with a second conductivity type that is opposite form the first conductivity type, wherein the second transistor comprises: a second source region and a second drain region; and a second interface material over the second source region and the second drain region.

Example 2: the CMOS device of Example 1, wherein the first interface material comprises germanium, and wherein the second interface material comprises TiSi.

Example 3: the CMOS device of Example 1 or Example 2, wherein a first thickness of the first interface material is between approximately 1 nm and approximately 10 nm, and wherein a second thickness of the second interface material is between approximately 1 nm and approximately 10 nm.

Example 4: the CMOS device of Example 3, wherein the first thickness is substantially equal to the second thickness.

Example 5: the CMOS device of Examples 1-4, wherein the first conductivity type is P-type, and wherein the second conductivity type is N-type.

Example 6: the CMOS device of Examples 1-4, wherein the first conductivity type is N-type, and wherein the second conductivity type is P-type.

Example 7: the CMOS device of Examples 1-6, wherein the first transistor and the second transistor are non-planar devices.

Example 8: the CMOS device of Example 7, wherein the non-planar devices are tri-gate devices.

Example 9: the CMOS device of Example 7, wherein the non-planar devices are gate-all-around (GAA) devices.

Example 10: the CMOS device of Examples 1-9, wherein the first transistor comprises a first number of fins, and wherein the second transistor comprises a second number of fins.

Example 11: the CMOS device of Example 10, wherein the second number of fins is greater than the first number of fins.

Example 12: the CMOS device of Examples 1-11, wherein the first source region and the first drain region comprise a diamond shaped region.

Example 13: a complementary metal-oxide-semiconductor (CMOS), comprising: a first non-planar transistor of a first conductivity type, wherein the first non-planar transistor comprises: a first fin extending up from a substrate; a second fin extending up from the substrate; a first source region connecting the first fin to the second fin; a first drain region connecting the first fin to the second fin; a first interface material over the first source region and the first drain region; and first contacts connected to the first interface material over the first source region and the first drain region; and a second non-planar transistor of a second conductivity type that is opposite from the first conductivity type, wherein the second non-planar transistor comprises: a third fin extending up from the substrate; a fourth fin extending up from the substrate; a fifth fin extending up from the substrate; a second source region connecting the third fin, the fourth fin, and the fifth fin together; a second drain region connecting the third fin, the fourth fin, and the fifth fin together; a second interface material over the second source region and the second drain region; and second contacts connected to the first interface material over the second source region and the second drain region.

Example 14: the CMOS device of Example 13, wherein the first conductivity type is P-type, and wherein the second conductivity type is N-type.

Example 15: the CMOS device of Example 13 or Example 14, wherein the first contacts and the second contacts comprise tungsten.

Example 16: the CMOS device of Examples 13-15, wherein the first interface material comprises germanium, and wherein the second interface material comprises TiSi.

Example 17: the CMOS device of Examples 13-16, wherein a first thickness of the first interface material is between approximately 1 nm and approximately 10 nm, and wherein a second thickness of the second interface material is between approximately 1 nm and approximately 10 nm.

Example 18: the CMOS device of Example 17, wherein the first thickness is substantially equal to the second thickness.

Example 19: a method of forming a complementary metal-oxide-semiconductor (CMOS) device, comprising: providing a first non-planar transistor of a first conductivity type and a second non-planar transistor of a second conductivity type that is opposite from the first conductivity type, wherein the first non-planar transistor comprises a first source region and a first drain region, and wherein the second non-planar transistor comprises a second source region and a second drain region; depositing a first interface material over the first source region, the first drain region, the second source region, and the second drain region; depositing a protective layer over the first interface material; forming a mask over the first source region and the first drain region, wherein the second source region and the second drain region are exposed; removing the protective layer and the first interface material from the second source region and the second drain region; removing the mask; selectively depositing a second interface material over only the second source region and the second drain region; removing the protective layer; and depositing a contact metal over the first interface material and the second interface material.

Example 20: the method of Example 19, wherein the first interface material is deposited with an epitaxial growth process.

Example 21: the method of Example 19 or Example 20, wherein the second interface material is deposited with a chemical vapor deposition process that only deposits on the second source region and the second drain region.

Example 22: the method of Example 21, wherein the first interface material comprises germanium, and wherein the second interface material comprises TiSi.

Example 23: the method of Examples 19-22, wherein the first interface material comprises a first thickness, and the second interface material comprises a second thickness that is substantially equal to the first thickness.

Example 24: an electronic device, comprising: a board; a package substrate attached to the board; and a die electrically coupled to the package substrate, wherein the die comprises a complimentary metal-oxide-semiconductor (CMOS) device, wherein the CMOS device comprises: a first transistor with a first interface material between a first source region and a first contact; and a second transistor with a second interface material between a second source region and a second contact.

Example 25: the electronic device of Example 24, wherein the first transistor is a P-type transistor, and wherein the second transistor is an N-type transistor.

What is claimed is:

1. A complementary metal-oxide semiconductor (CMOS) device, comprising:
a first transistor with P-type conductivity, wherein the first transistor comprises:
a first source region and a first drain region; and
a first interface material over the first source region and the first drain region; and
a second transistor with N-type conductivity, wherein the second transistor comprises:
a second source region and a second drain region; and
a second interface material over the second source region and the second drain region, wherein the second interface material comprises titanium, and the first interface material does not include titanium.

2. The CMOS device of claim 1, wherein the first interface material comprises germanium, and wherein the second interface material comprises TiSi.

3. The CMOS device of claim 1, wherein a first thickness of the first interface material is between approximately 1 nm and approximately 10 nm, and wherein a second thickness of the second interface material is between approximately 1 nm and approximately 10 nm.

4. The CMOS device of claim 3, wherein the first thickness is substantially equal to the second thickness.

5. The CMOS device of claim 1, wherein the first transistor and the second transistor are non-planar devices.

6. The CMOS device of claim 5, wherein the non-planar devices are tri-gate devices.

7. The CMOS device of claim 5, wherein the non-planar devices are gate-all-around (GAA) devices.

8. The CMOS device of claim 1, wherein the first transistor comprises a first number of fins, and wherein the second transistor comprises a second number of fins.

9. The CMOS device of claim 8, wherein the second number of fins is greater than the first number of fins.

10. The CMOS device of claim 1, wherein the first source region and the first drain region comprise a diamond shaped region.

11. A complementary metal-oxide-semiconductor (CMOS), comprising:
a first non-planar transistor of P-type conductivity, wherein the first non-planar transistor comprises:
a first fin extending up from a substrate;
a second fin extending up from the substrate;
a first source region connecting the first fin to the second fin;
a first drain region connecting the first fin to the second fin;
a first interface material over the first source region and the first drain region; and first contacts connected to the first interface material over the first source region and the first drain region; and a second non-planar transistor of N-type conductivity, wherein the second non-planar transistor comprises:

a third fin extending up from the substrate;

a fourth fin extending up from the substrate;

a fifth fin extending up from the substrate;

a second source region connecting the third fin, the fourth fin, and the fifth fin together;

a second drain region connecting the third fin, the fourth fin, and the fifth fin together;

a second interface material over the second source region and the second drain region, wherein the second interface material comprises titanium, and the first interface material does not include titanium; and second contacts connected to the first interface material over the second source region and the second drain region.

12. The CMOS device of claim 11, wherein the first contacts and the second contacts comprise tungsten.

13. The CMOS device of claim 11, wherein the first interface material comprises germanium, and wherein the second interface material comprises TiSi.

14. The CMOS device of claim 11, wherein a first thickness of the first interface material is between approximately 1 nm and approximately 10 nm, and wherein a second thickness of the second interface material is between approximately 1 nm and approximately 10 nm.

15. The CMOS device of claim 14, wherein the first thickness is substantially equal to the second thickness.

16. An electronic device, comprising:

a board;

a package substrate attached to the board; and a die electrically coupled to the package substrate, wherein the die comprises a complimentary metal-oxide-semiconductor (CMOS) device, wherein the CMOS device comprises:

a first transistor with a first interface material between a first source region and a first contact, the first source region having P-type conductivity; and a second transistor with a second interface material between a second source region and a second contact, the second source region having N-type conductivity, wherein the second interface material comprises titanium, and the first interface material does not include titanium.

17. The electronic device of claim 16, wherein the first transistor is a P-type transistor, and wherein the second transistor is an N-type transistor.

* * * * *